United States Patent
Lee et al.

(10) Patent No.: US 10,388,402 B2
(45) Date of Patent: Aug. 20, 2019

(54) MEMORY SYSTEM AND MEMORY CONTROL METHOD

(71) Applicant: SAMSUNG ELECTRONICS CO., LTD., Suwon-si (KR)

(72) Inventors: Sang Min Lee, Daegu (KR); Jae Hyung Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 35 days.

(21) Appl. No.: 15/648,909

(22) Filed: Jul. 13, 2017

(65) Prior Publication Data

US 2018/0075928 A1 Mar. 15, 2018

(30) Foreign Application Priority Data

Sep. 9, 2016 (KR) .................. 10-2016-0116117

(51) Int. Cl.
| | | |
|---|---|---|
| *G11C 29/52* | (2006.01) | |
| *G01R 31/28* | (2006.01) | |
| *G11C 29/56* | (2006.01) | |
| *G06F 1/12* | (2006.01) | |
| *G11C 29/02* | (2006.01) | |

(52) U.S. Cl.
CPC .......... *G11C 29/52* (2013.01); *G01R 31/2834* (2013.01); *G06F 1/12* (2013.01); *G11C 29/023* (2013.01); *G11C 29/028* (2013.01); *G11C 29/56012* (2013.01)

(58) Field of Classification Search
CPC ..... G11C 29/52; G11C 29/023; G11C 29/028; G11C 29/56012; G06F 1/12; G01R 31/2834

USPC ........ 714/718, 719, 736, 742, 744; 365/193, 365/194, 233.1, 200, 201
See application file for complete search history.

(56) References Cited

U.S. PATENT DOCUMENTS

| | | | | |
|---|---|---|---|---|
| 6,918,048 | B2* | 7/2005 | Zumkehr | G06F 13/1689 327/262 |
| 7,755,955 | B2* | 7/2010 | Seo | G11C 7/1051 365/189.15 |
| 7,759,998 | B2* | 7/2010 | Ishikawa | H03K 5/135 327/261 |
| 9,209,961 | B1* | 12/2015 | Notani | H03K 5/14 |
| 9,437,326 | B2 | 9/2016 | Razzaz et al. | |
| 9,568,542 | B2* | 2/2017 | Lin | G01R 31/2834 |
| 2001/0046163 | A1* | 11/2001 | Yanagawa | G06F 13/1689 365/194 |
| 2003/0021164 | A1* | 1/2003 | Yoo | G11C 7/1051 365/193 |
| 2007/0176658 | A1* | 8/2007 | Ishikawa | H03K 5/135 327/161 |
| 2009/0067268 | A1* | 3/2009 | Seo | G11C 7/1051 365/193 |
| 2014/0181429 | A1* | 6/2014 | Malladi | G06F 12/00 711/154 |

(Continued)

*Primary Examiner* — John J Tabone, Jr.
(74) *Attorney, Agent, or Firm* — Sughrue Mion, PLLC (57) ABSTRACT

A memory system includes a memory device, and a memory controller. The controller adjusts a delay of a data strobe clock, performs at least one of a read test and a write test on the memory device, detect at least one data bit, which reduces at least one margin of a setup margin and a hold margin, from among a plurality of data bits, and adjusts a delay of the at least one data bit to allow the at least one margin to increase.

20 Claims, 9 Drawing Sheets

(56) References Cited

U.S. PATENT DOCUMENTS

| | | | |
|---|---|---|---|
| 2014/0321229 A1* | 10/2014 | Duffner | G11C 7/1009 365/233.13 |
| 2015/0088437 A1* | 3/2015 | Lin | G01R 31/2834 702/58 |
| 2015/0364212 A1 | 12/2015 | Razzaz et al. | |

* cited by examiner

MEMORY SYSTEM AND MEMORY CONTROL METHOD

CROSS-REFERENCE TO RELATED APPLICATION

This application claims priority under 35 U.S.C. § 119(a) of a Korean patent application filed on Sep. 9, 2016 in the Korean Intellectual Property Office and assigned Serial number 10-2016-0116117, the disclosure of which is hereby incorporated by reference in its entirety.

FIELD

Methods and apparatuses consistent with example embodiments relate to a memory system and a memory control method.

BACKGROUND

A characteristic of a memory may depend on an environment where the memory is located, the number of times that the memory has been used, and a lapse of time between uses. In a memory system, a data skew may occur on a memory interface due to a change in voltage or a change in environment.

To reduce the data skew and latch data in a stable manner, the memory system may calibrate a data strobe clock signal. For example, through the calibration, the memory system may place the data strobe signal at the center of a timing margin of a data signal.

The memory system may perform the calibration operation before making a request to the memory device for a read operation and a write operation (initial training). However, the calibration operation that is performed before the read operation and the write operation may fail to improve the timing margin reduced due to an environment in which the memory system (or memory device) is used.

SUMMARY

Aspects of one or more example embodiments may address at least the above-mentioned problems and/or disadvantages and other disadvantages not described above. Also, example embodiments are not required to overcome the disadvantages described above, and may not overcome any of the problems described above.

According to an aspect of an example embodiment, there is provided a memory system including: a memory device; and a memory controller electrically connected with the memory device, the memory controller being configured to: adjust a delay of a data strobe clock; perform a test on the memory device while adjusting the delay of the data strobe clock; detect a first data bit of a plurality of data bits which reduces a margin, the margin corresponding to one among a setup margin and a hold margin; and adjust a delay of the first data bit to allow the margin to increase.

The memory controller may be further configured to adjust the data strobe clock to a specified setup margin location before performing the test.

The memory controller may be further configured to adjust the data strobe clock to a specified hold margin location before performing the test.

The test may be a read test, and the memory controller may include a memory and be further configured to: read a reference pattern stored in the memory; store the reference pattern, as read from the memory, in the memory device; read the reference pattern from the memory device; compare the reference pattern read from the memory device and the reference pattern stored in the memory; and detect a second bit from among bits constituting the reference pattern read from the memory device which does not coincide with a corresponding bit of the reference pattern stored in the memory.

The memory controller may be further configured to store the reference pattern as read from the memory in the memory device before adjusting the delay of the data strobe clock; and read the reference pattern from the memory device after adjusting the data strobe clock to one among a specified setup margin location and a specified hold margin location.

The test may be a write test, and the memory controller may include a memory and be further configured to: read a reference pattern stored in the memory; write the reference pattern, as read from the memory, in the memory device; read the reference pattern stored in the memory device; compare the reference pattern read from the memory device and the reference pattern stored in the memory; and detect a second bit from among bits constituting the reference pattern read from the memory device which does not coincide with a corresponding bit of the reference pattern stored in the memory.

The memory controller may be further configured to: write the reference pattern in the memory device after adjusting the data strobe clock to one among a specified setup margin location and a specified hold margin location; and read the reference pattern stored in the memory device after restoring the data strobe clock to a previous location.

The memory controller may be further configured to perform the test when a read operation and a write operation are not performed on the memory device after initialization of the memory device.

The memory controller may be further configured to: perform the test after the read operation is performed by at least a first threshold count; and perform the test after the write operation is performed by a at least second threshold count.

The memory controller may be further configured to adjust the delay of the data strobe clock such that the data strobe clock is placed at a center of a data margin in response to the delay of the at least one data bit being adjusted.

According to an aspect of another example embodiment, there is provided a method of controlling a memory system, the method including: adjusting a delay of a data strobe clock; performing a test on a memory device; detecting a first data bit of a plurality of data bits which reduces a margin, the margin corresponding to one among a setup margin and a hold margin; and adjusting a delay of the first data bit to allow the margin to increase.

The performing may include adjusting the data strobe clock to a specified setup margin location before performing the test.

The test may be a read test, and the performing of the test may include adjusting the data strobe clock to one among a specified setup margin location and a specified hold margin location before performing the test.

The test may be a read test, and the performing of the test may include storing the reference pattern stored in an internal memory of the memory device before adjusting the delay of the data strobe clock.

The test may be a write test, and the performing of the test may include: writing a reference pattern in the memory device; and reading the reference pattern from the memory device.

The writing may include writing the reference pattern in the memory device after adjusting the data strobe clock to one among a specified setup margin location and a specified hold margin location.

The reading may include: restoring the data strobe clock to a previous location before adjusting the one among the specified setup margin location and the specified hold margin location; and reading the reference pattern from the memory device.

The performing may include: storing a specified reference pattern in the memory device; and reading the reference pattern from the memory device, and the detecting may include: comparing the reference pattern as read from the memory device and the specified reference pattern; and detecting a second bit from among bits constituting the reference pattern read from the memory device which does not coincide with the corresponding bit of the specified reference pattern.

The performing may be performed in at least one case among a first case where a read operation is performed by at least a first threshold count after initialization of the memory device and a second case where a write operation is performed by at least a second threshold count after the initialization of the memory device.

According to an aspect of yet another example embodiment, there is provided a memory controller including: a storage unit configured to store a setup margin and a hold margin; and a processor configured to adjust a delay of a data strobe clock, perform a test on a memory device while adjusting the delay of the data strobe clock, detect a first data bit of a plurality of data bits which reduces a margin corresponding to one among the setup margin and the hold margin, and adjust a delay of the first data bit to allow the margin to increase.

Other aspects, advantages, and salient features of the disclosure will become apparent to those skilled in the art from the following detailed description, which, taken in conjunction with the annexed drawings, discloses various example embodiments of the present disclosure.

BRIEF DESCRIPTION OF THE DRAWINGS

The above and/or other aspects will be more apparent from the following description of example embodiments, taken in conjunction with the accompanying drawings, in which.

Throughout the drawings, it should be noted that like reference numbers are used to depict the same or similar elements, features, and structures.

DETAILED DESCRIPTION

Example embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the example embodiments. However, it is apparent that the example embodiments can be practiced without those specifically defined matters. Also, well-known functions or constructions may not be described in detail to avoid obscuring the description with unnecessary detail.

Figure 1:
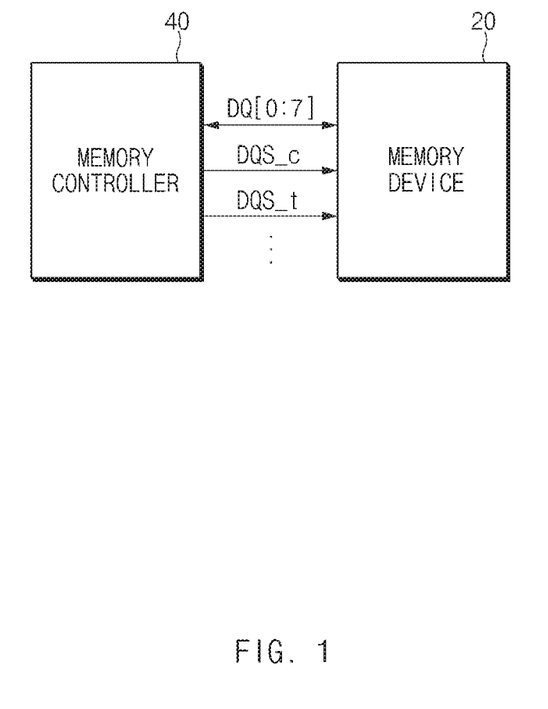
FIG. 1 is a configuration diagram illustrating a memory system according to an example embodiment.
Figure 2:
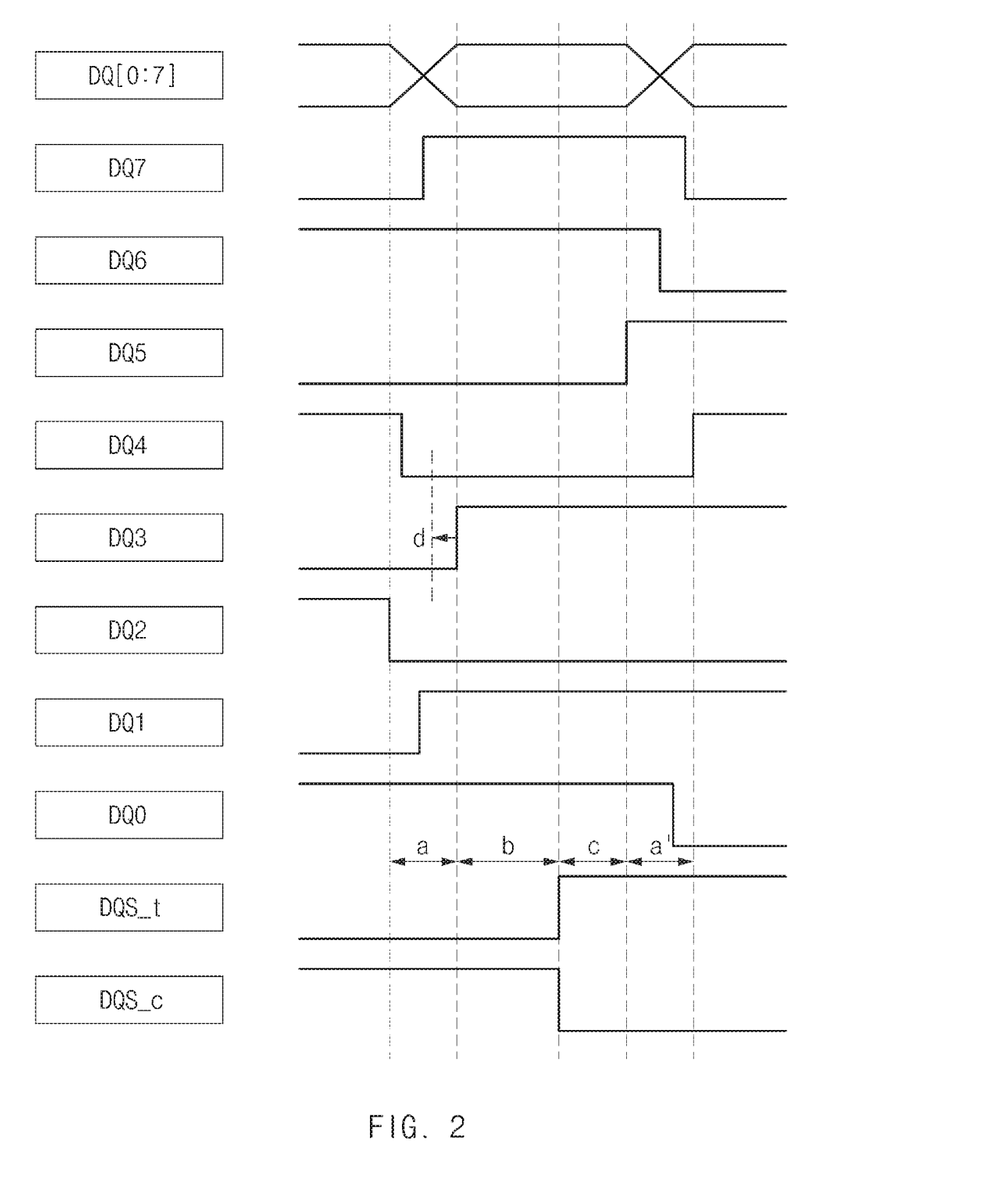
FIGS. 2 and 3 are timing diagrams of a data interface according to an example embodiment.
Figure 3:
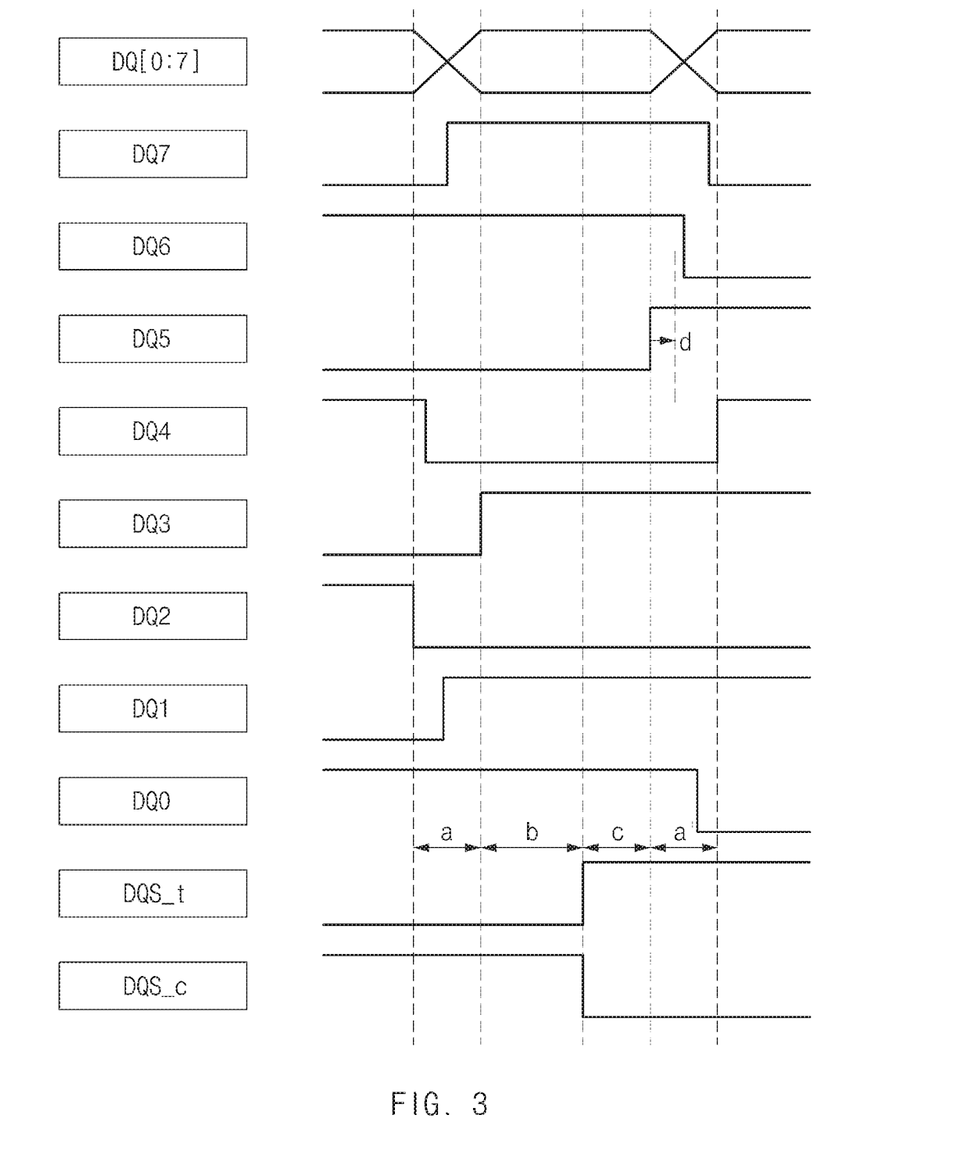

FIG. 1 is a configuration diagram illustrating a memory system according to an example embodiment, and FIGS. 2 and 3 are timing diagrams of a data interface according to an example embodiment.

As illustrated in FIG. 1, the memory system according to an example embodiment may include a memory device 20 and a memory controller 40.

According to an example embodiment, the memory device 20 may store data under control of the memory controller 40. For example, the memory device 20 may include various memory devices such as a double data rate (DDR) memory, a flash memory, a single data rate (SDR) memory, a hard disk, and the like.

According to an example embodiment, the memory device 20 and the memory controller 40 may be connected to each other with a plurality of data input/output interfaces and an interface for control. The plurality of data input/output interfaces may include a plurality of data bits DQs. For example, the plurality of data bits may be 8 bits. For example, the data bits may be signals for the read operation and the write operation of the memory device 20 and for address appointment of the read operation and the write operation. The interface for control may include one or more data strobe clock DQS_c and DQS_t and any other control signal. For example, the data strobe clock DQS_c and DQS_t may be a signal for providing a reference point in time when data are written and read. In this specification, the case where the number of data strobe clocks is "2" is exemplified. However, example embodiments are not limited thereto. The any other control signal may be a signal that changes according to a kind of the memory device 20. For example, the any other control signal may include a write enable signal WE, a read enable signal RE, an address addr, a chip select signal CS, a command CMD, and the like. The write enable signal WE may refer to a signal for providing notification that the memory controller 40 is performing the write operation on the memory device 20. The read enable signal RE may refer to a signal for providing notification that the memory controller 40 is performing the read operation on the memory device 20. The address addr may refer to a signal for indicating whether the plurality of data bits transmitted from the memory controller 40 to the memory device 20 are an address or data. The chip select signal CS may refer to a signal for informing that the memory controller 40 is selecting the memory device 20 among a plurality of memory devices as an interface subject. The command CMD may refer to a signal for determining whether data transferred through a plurality of data bits are a command or data.

According to an example embodiment, the memory controller 40 may control the read operation and the write operation of the memory device 20. For example, the memory controller 40 may be a device that controls the read operation and the write operation of the memory device 20 between a processor and the memory device 20 under control of the processor. According to an example embodiment, the memory controller 40 may control an erase operation of the memory device 20. The memory controller 40 may be implemented in the form of a system on chip (SoC). In an example embodiment, the processor may include one or more of a central processing unit (CPU), an application processor (AP), or a communication processor (CP). For example, the processor may be a main processor of an electronic device to which the memory system is applied.

Referring to FIG. 2 or 3, the memory controller 40 according to an example embodiment may specify a specific address of the memory device 20 to write a plurality of data bits in the memory device 20 or to read a plurality of data bits from the memory device 20. In an example embodiment, the memory controller 40 may write or read a plurality of data bits in synchronization with a specified edge of a data strobe clock. For example, the specified edge may be at least one of a rising edge and a falling edge. In an example embodiment, the specified edge of the data strobe clock DQS_t may be the rising edge. The specified edge of the data strobe clock DQS_c may be the falling edge.

Referring to FIG. 2 or 3, an "a" period and an "a'" period may be a transition period of the plurality of data bits DQ[7:0]. The "a" period and the "a'" period may be determined according to a timing difference between a plurality of data bits. A setup margin "b" may be a time interval from a second point in time when state transitions of all the data bits are completed to a state transition time point (a third time point) of a specified edge of the data strobe clock DQS_t or DQS_c. The setup margin "b" may be determined by a data bit, which is the last in timing, from among the plurality of data bits. A hold margin "c" may be a time interval from the state transition time point (the third time point) of the specified edge of the data strobe clock to a point in time (a fourth time point) when next state transitions of the plurality of data bits start. The hold margin "c" may be determined by a data bit, which is the earliest in timing, from among the plurality of data bits. A timing margin "b+c" may be a sum of the setup margin "b" and the hold margin "c".

According to an example embodiment, the memory controller 40 may measure the timing margin of the memory device 20 by performing a read test and a write test on the memory device 20 while adjusting a delay of the data strobe clock. For example, the memory controller 40 may perform the read test or the write test on the memory device 20 after adjusting a specified edge of the data strobe clock to a specified setup margin location (e.g., a start time point of the "b" period). The memory controller 40 may detect at least one data bit, which reduces the setup margin, from among the plurality of data bits by performing the read test or the write test while the specified edge of the data strobe clock is located at the specified setup margin location. The memory controller 40 may detect at least one data bit, which reduces the hold margin, from among the plurality of data bits by performing the read test or the write test after adjusting the specified edge of the data strobe clock to the specified hold margin location (e.g., a start time point of the "c" period).

According to an example embodiment, when performing the read test, the memory controller 40 may read a reference pattern (or reference data) stored in the memory device 20 after adjusting a delay of the data strobe clock to the setup margin or hold margin location. For example, the reference pattern stored in the memory device 20 may be a specified reference pattern written in the memory device 20 before the memory controller 40 adjusts the delay of the data strobe clock or performs the read test. For example, the specified reference pattern may be stored in an internal memory of the memory controller 40. The memory controller 40 may compare bits constituting the read reference pattern and bits constituting the specified reference pattern. The memory controller 40 may determine bits, which do not coincide with each other, from among the bits constituting the read reference pattern and the bits constituting the specified reference pattern as a data bit that reduces the setup margin or the hold margin. In an example embodiment, the reference pattern may include at least two data, in which values of each of bits constituting one data are opposite to corresponding a bit from among bits constituting the other data. For example, in the case where each data is composed of 8 data bits, the reference pattern may include two data of "01010101" and "10101010".

According to an example embodiment, when performing the write test, the memory controller 40 may write a specified reference pattern in the memory device 20 after adjusting a delay of the data strobe clock to the specified setup margin location or the specified hold margin location. After writing the specified reference pattern, the memory controller 40 may restore the delay of the data strobe clock to an original location (or a previous location) before adjusting and may then read the pattern written in the memory device 20. The memory controller 40 may detect at least one data bit, which reduces the setup margin or the hold margin, by comparing a pattern read from the memory device 20 and a reference pattern of the internal memory. For example, the memory controller 40 may determine all bits which do not coincide with the corresponding bit of the reference pattern of the internal memory, from among the bits constituting the read pattern as a data bit that reduces the setup margin or the hold margin.

According to an example embodiment, the memory controller 40 may adjust a delay of the detected bit, which reduces the setup margin or the hold margin, in a direction in which the setup margin or the hold margin increases. For example, the memory controller 40 may secure the setup margin by advancing a delay of the detected data bit (refer to "d" of FIG. 2) or delaying the delay of the detected data bit (refer to "d" of FIG. 3).

According to an example embodiment, in the process of initializing the memory device 20, the memory controller 40 may set a delay, through which the timing margin is most largely secured, from among all possible delays as a delay of each data bit by performing the read operation (or read test) or the write operation (or write test) while adjusting a delay of a plurality of data bits based on the data strobe clock.

According to an example embodiment, the memory controller 40 may perform the read test and the write test on the memory device 20 while using the memory device 20. For example, the memory controller 40 may perform the read test and the write test periodically. If the read operation or the write operation is requested from the processor during the read test or the write test, the memory controller 40 may make the requested operation wait for a while. The memory controller 40 may perform the waiting operation after the read test or the write test is completely performed.

According to an example embodiment, the memory controller 40 may perform the read test and the write test if a threshold time elapses after the initialization of the memory device 20. For example, the threshold time may be determined by using a point in time when power integration (PI) and signal integrity (SI) influences occur due to a time delay and the like after the initialization of the memory device 20. The memory controller 40 may perform at least one of the read test and the write test after at least one of the read operation and the write operation is performed by a first threshold count or more after the initialization of the memory device 20. For example, the first threshold count may be experimentally set by using the number of times that the PI and SI influences occur due to iteration of operations after the initialization of the memory device 20.

Various example embodiments may adjust a delay of a data bit that causes a decrease in timing margin. Various example embodiments may reduce a decrease in a timing margin due to the PI and SI influences as the memory device 20 is used.

Figure 4:
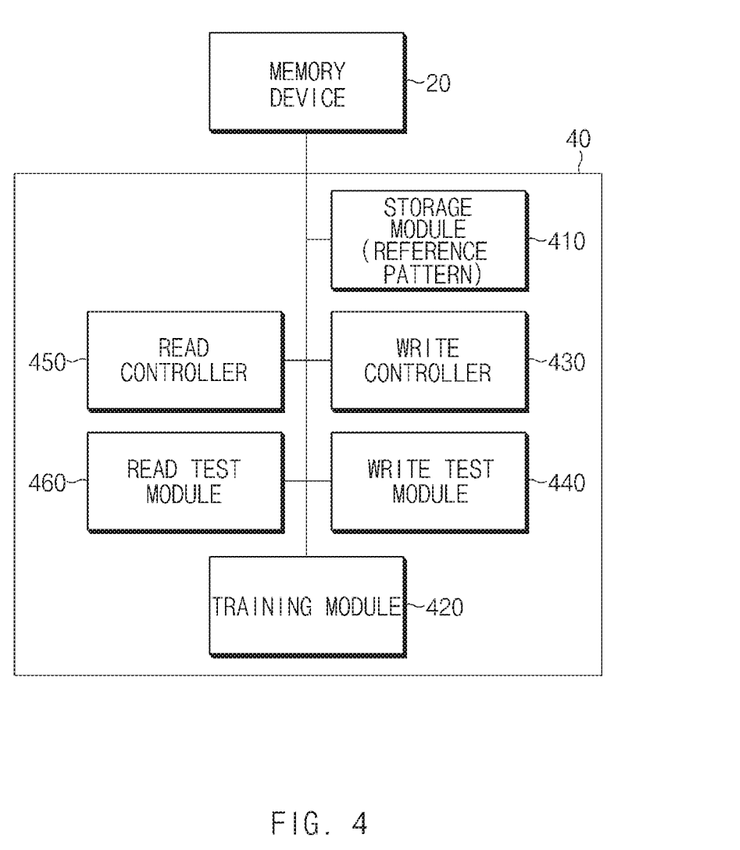
FIG. 4 is a configuration diagram illustrating a memory controller according to an example embodiment.
Figure 5:
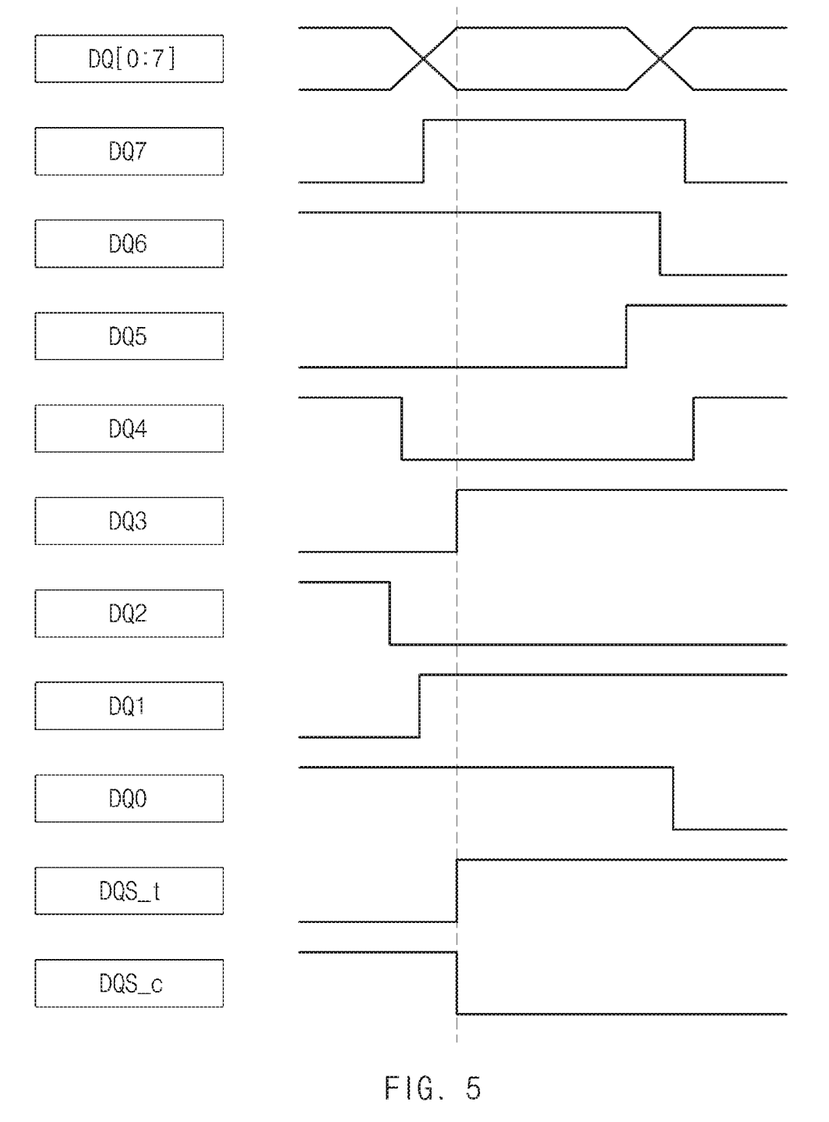
FIG. 5 is a timing diagram illustrating a setup margin test process according to an example embodiment.
Figure 6:
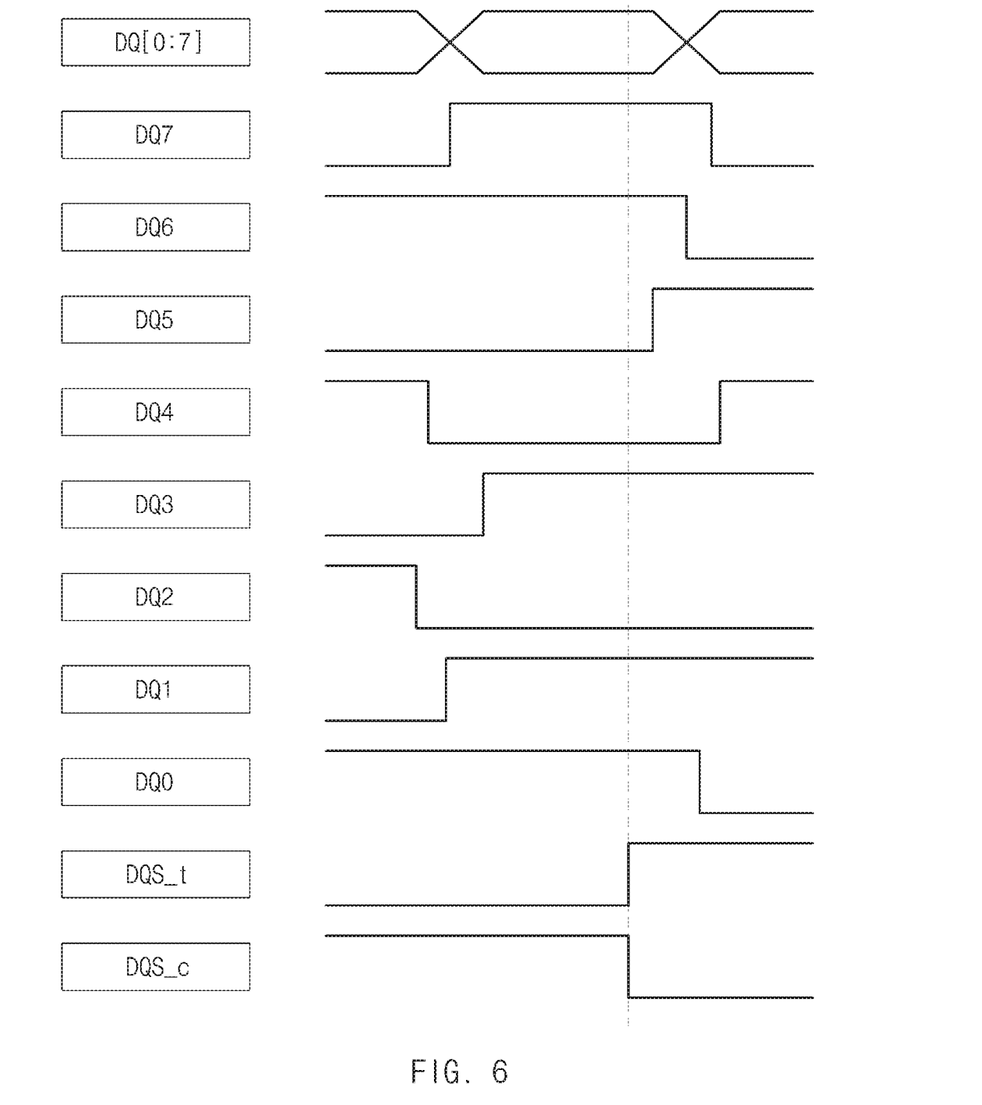
FIG. 6 is a timing diagram illustrating a hold margin test process according to an example embodiment.

FIG. 4 is a configuration diagram illustrating a memory controller according to an example embodiment, FIG. 5 is a timing diagram of a setup margin test process according to an example embodiment, and FIG. 6 is a timing diagram of a hold margin test process according to an example embodiment.

As illustrated in FIG. 4, the memory controller 40 according to an example embodiment may include a storage module 410, a training module 420, a read controller 450, a write controller 430, a read test module 460, and a write test module 440. At least one of the training module 420, the read controller 450, the write controller 430, the read test module 460, and the write test module 440 according to an example embodiment may be omitted. In an example embodiment, each element of the memory controller 40 may be a hardware module of at least one processor or may be a software module implemented by the at least one processor. For example, the elements included in the memory controller 40 may be included in the at least one processor or may be respectively included in separate processors.

According to an example embodiment, the storage module 410 may store test information for the read test and the write test. For example, the test information may include a reference pattern, a setup margin location, a hold margin location, addresses for read and write tests, and the like. The reference pattern may be data for verifying a timing margin of a plurality of data bits, for example. The reference pattern may be data, states of which transition at a plurality of operation periods. For example, in the case where a plurality of data bits are 8 bits, first data of the reference data may be formed of bits of "01010101", and second data thereof may be formed of bits of "10101010". In an example embodiment, the storage module 410 may be an internal (or embedded) memory of the memory controller 40.

According to an example embodiment, the training module 420 may verify a timing margin of a plurality of data bits in the process of initializing the memory device 20. For example, the training module 420 may verify a timing margin of each data bit by performing at least one of the read and write operations while adjusting an interface delay of each data bit. For example, the training module 420 may respectively adjust the interface delays of the plurality of data bits based on a data strobe clock. The training module 420 may set an interface delay, which increases a timing margin most largely, from among the adjusted interface delays as an interface delay of each data bit.

According to an example embodiment, the read controller 450 may perform the read operation on the memory device 20 under control of the processor.

According to an example embodiment, the read controller 450 may adjust an interface delay of a read operation of a plurality of data bits. For example, the read controller 450 may adjust an interface delay associated with a read operation of the plurality of data bits in response to a request of at least one of the training module 420 and the read test module 460. For example, each interface delay may be advanced or delayed by a specified time unit (e.g., 1 ms). For example, the specified time unit may be a multiple of 1/n of the data strobe clock.

According to an example embodiment, the write controller 430 may perform the write operation on the memory device 20 under control of the processor.

According to an example embodiment, the write controller 430 may adjust an interface delay of a write operation of a plurality of data bits. For example, the write controller 430 may adjust an interface delay associated with a write operation of the plurality of data bits in response to a request of at least one of the training module 420 and the write test module 440. For example, each interface delay may be advanced or delayed by a specified time unit (e.g., 1 ms). For example, the specified time unit may be a multiple of 1/n of the data strobe clock.

According to an example embodiment, the read test module 460 may perform a read test for verifying a timing margin of a read operation of the memory device 20. For example, the read test module 460 may adjust a delay of the data strobe clock to a specified setup margin location or a specified hold margin location and may perform the read test on the memory device 20. The read test module 460 may detect a bit, which reduces the setup margin or the hold margin, as the read test result.

According to an example embodiment, the read test module 460 may adjust the data strobe clock to a setup margin location and may read a first pattern stored in the memory device 20. The first pattern may be a reference pattern that is written in the memory device 20 by the write controller 430 or the write test module 440 before the read test is performed or before a location of the data strobe clock is adjusted to the setup margin location. The read test module 460 may compare each bit of the read first pattern and each bit of the reference pattern of the storage module 410. The read test module 460 may detect all bits, which does not coincide with the corresponding bit of the reference pattern, from among the bits constituting the first pattern as at least one bit that reduces the setup margin. If at least one unconformable bit is present, the read test module 460 may output a setup margin fail flag.

Referring to FIG. 5, for example, bits DQ[7:0] of the reference pattern may be "11001011", and bits DQ[7:0] of the first pattern read from the memory device 20 may be "11000011". In this case, the read test module 460 may detect the "DQ3" bit as a data bit that reduces the setup margin.

According to an example embodiment, the read test module 460 may provide the read controller 450 with information of the data bit that reduces the setup margin. If the information of the data bit reducing the setup margin is received, the read controller 450 may secure a setup margin of the read operation by advancing a delay of the data bit reducing the setup margin. For example, the read controller 450 may move (e.g., shift) the data bit reducing the setup margin by at least one time unit to the left of a specified edge of the data strobe clock.

According to an example embodiment, the read test module 460 may read a first pattern stored in the memory device 20 after adjusting the data strobe clock to the setup margin location. In an example embodiment, the read test module 460 may compare each bit of the read first pattern and each bit of the reference pattern of the storage module 410. If each bit of the read first pattern does not coincide with each bit of the reference pattern of the storage module 410, the read test module 460 may output a hold margin fail flag. In an example embodiment, the read test module 460 may detect all bits, which does not coincide with the corresponding bit of the reference pattern, from among the bits constituting the first pattern as a bit that reduces the hold margin.

Referring to FIG. 6, for example, bits DQ[7:0] of the reference pattern may be "11001011", and bits DQ[7:0] of the read first pattern may be "11101011". In this case, the read test module 460 may detect the "DQ5" bit as a data bit that reduces the hold margin.

According to an example embodiment, the read test module 460 may provide the read controller 450 with information of the data bit that reduces the hold margin. If the information of the data bit reducing the hold margin is received, the read controller 450 may secure a hold margin of the read operation by delaying a delay of the data bit (e.g., DQ5) reducing the hold margin. For example, the read controller 450 may move (e.g., shift) the data bit (e.g., DQ5) reducing the hold margin by at least one time unit to the right of a specified edge of the data strobe clock.

According to an example embodiment, if there is adjusted a delay of a data bit reducing the setup margin or the hold margin of the read operation, the read test module 460 may again perform the read test to verify whether the setup margin or the hold margin is secured. For example, the read test module 460 may perform the read test immediately after the delay is adjusted. According to another example embodiment, the read test module 460 may verify whether the setup margin or the hold margin of the read operation is increased, through the next read test.

According to another example embodiment, the read test module 460 may verify the setup margin and the hold margin through one read test. Alternatively, the read test module 460 may verify only one of the setup margin and the hold margin through one read test.

According to an example embodiment, the write test module 440 may adjust the data strobe clock to a setup margin location upon performing the write test and may write a reference pattern in the memory device 20. After writing the reference pattern, the write test module 440 may restore the data strobe clock to an original location (or a previous location) and may then read a second pattern, which is stored in the memory device 20, from the memory device 20. The write test module 440 may compare the read second pattern and the reference pattern stored in the storage module 410 for each data bit. If the read second pattern does not coincide with the reference pattern stored in the storage module 410, the write test module 440 may output a setup margin fail flag. The write test module 440 may detect all bits, which does not coincide with the corresponding bit of the reference pattern, from among the bits constituting the second pattern as at least one bit that reduces the setup margin.

The write test module 440 may provide the write controller 430 with information of the data bit that reduces the setup margin. If the information of the data bit reducing the setup margin is received, the write controller 430 may secure a setup margin of the write operation by advancing a delay of the data bit (e.g., DQ5) reducing the setup margin. For example, the write controller 430 may move (e.g., shift) the data bit (e.g., DQ5) reducing the setup margin by at least one time unit to the left of a specified edge of the data strobe clock.

According to an example embodiment, the write test module 440 may adjust the data strobe clock to a hold margin location upon performing the write test and may store a reference pattern in the memory device 20. The write test module 440 may restore the data strobe clock to an original location (or a previous location) before adjusting of the data strobe clock and may then read a second pattern stored in the memory device 20. The write test module 440 may compare the read second pattern and the reference pattern stored in the storage module 410 for each data bit. If the read second pattern does not coincide with the reference pattern of the storage module 410, the write test module 440 may output a hold margin fail flag. The write test module 440 may detect all bits, which does not coincide with the corresponding bit of the reference pattern, from among the bits constituting the second pattern as at least one bit that reduces the hold margin.

The write test module 440 may provide the write controller 430 with information of the data bit that reduces the hold margin. If the information of the data bit reducing the hold margin is received, the write controller 430 may secure a hold margin of the write operation by delaying a delay of the data bit reducing the hold margin. For example, the write controller 430 may move (e.g., shift) the data bit reducing the hold margin by at least one time unit to the right of a specified edge of the data strobe clock.

According to another example embodiment, the write test module 440 may verify the setup margin and the hold margin through one write test. The write test module 440 may verify only one of the setup margin and the hold margin through one write test.

According to an example embodiment, the read test module 460 may perform the read test such that the read operation and the write operation do not overlap each other. For example, the read test module 460 may periodically verify whether the read operation and the write operation of the memory device 20 are requested. The read test module 460 may perform the read test at a point in time when the read operation and the write operation are not performed. The read test module 460 may perform the read test at a specific state (e.g., a sleep state) of the processor in which the read operation and the write operation do not occur. In an example embodiment, also, the write test module 440 may perform the write test on the memory device 20 when there is no operation (e.g., the read operation and the write operation) associated with the memory device 20 in a specific period or at a specific state of the processor.

According to an example embodiment, a specified one among the read test module 460 and the write test module 440 may have a priority such that collision does not occur between the write test and the read test. For example, the read test module 460 may have the priority in the case where the memory controller 40 stores a reference pattern in the memory device 20 in advance during the initialization process or the like. Since the read test is possible after the reference pattern is written, the write test module 440 may have the priority.

According to an example embodiment, if the memory device 20 is initialized and then a threshold time elapses or each operation is performed by a threshold count, the read test module 460 and the write test module 440 may perform the read test and the write test, respectively. For example, if a threshold time elapses at a point in time when the memory device 20 is initialized or after the read operation is performed by a threshold count, the read test module 460 may perform the read test. For example, after the write operation is performed by a threshold count, the read test module 460 may perform the read test. If a threshold time elapses at a point in time when the memory device 20 is initialized or after the write operation is performed by a threshold count, the write test module 440 may perform the write test. For example, after the read operation is performed by a threshold count, the write test module 440 may perform the write test. In an example embodiment, an efficient test may be possible by performing the read test and the write test from a point in time when the SI and PI influences occur due to the use of the memory device 20. At least one of the first threshold count, the second threshold count, the third threshold count and forth threshold count may be the same. The first threshold count, the second threshold count, the third threshold count and forth threshold count may be all different from each other.

According to an example embodiment, in the case of the write test module 440, addresses at which reference patterns for the write tests are respectively written may be different from each other. According to an example embodiment, addresses at which reference patterns are written to verify the setup margin and the hold margin during one write test may be different from each other. According to another example embodiment, the write test module 440 may erase the reference pattern after one write test. In this case, in an example embodiment, it may be possible to prevent a reference pattern written during a previous test from being verified abnormally during the write test. Accordingly, an abnormal write test may be prevented.

According to an example embodiment, the read test module 460 and the write test module 440 may use different reference patterns in the read test and the write test. At least one of the read test module 460 and the write test module 440 may use different addresses in respective tests. For example, the write test module 440 may perform the write test after storing a reference pattern at a next address at which data of the memory device 20 are not stored.

According to an example embodiment, in the case of adjusting a delay of a data bit, the read controller 450 and the write controller 430 may adjust the data strobe clock to the center of the timing margin (centering). The read controller 450 and the write controller 430 may adjust a delay of the data strobe clock in consideration of both the setup margin and the hold margin secured through adjusting the delay of the data bit. For example, in the case of advancing a delay of a data bit to secure the setup margin, the read controller 450 and the write controller 430 may advance the data strobe clock by half the delay of the data bit thus advanced. In the case of delaying a delay of a data bit to secure the hold margin, the read controller 450 and the write controller 430 may delay the data strobe clock by half the delay of the data bit thus delayed. If the delay of the data bit is adjusted by the odd number of time units, the read controller 450 and the write controller 430 may adjust the delay of the data strobe clock by a quotient obtained by dividing the adjusted delay by 2.

Various example embodiments may somewhat improve a reduced timing margin by verifying whether the timing margin is reduced due to the PI or SI influence while the memory device 20 is used in a board environment of the memory device 20.

Figure 7:
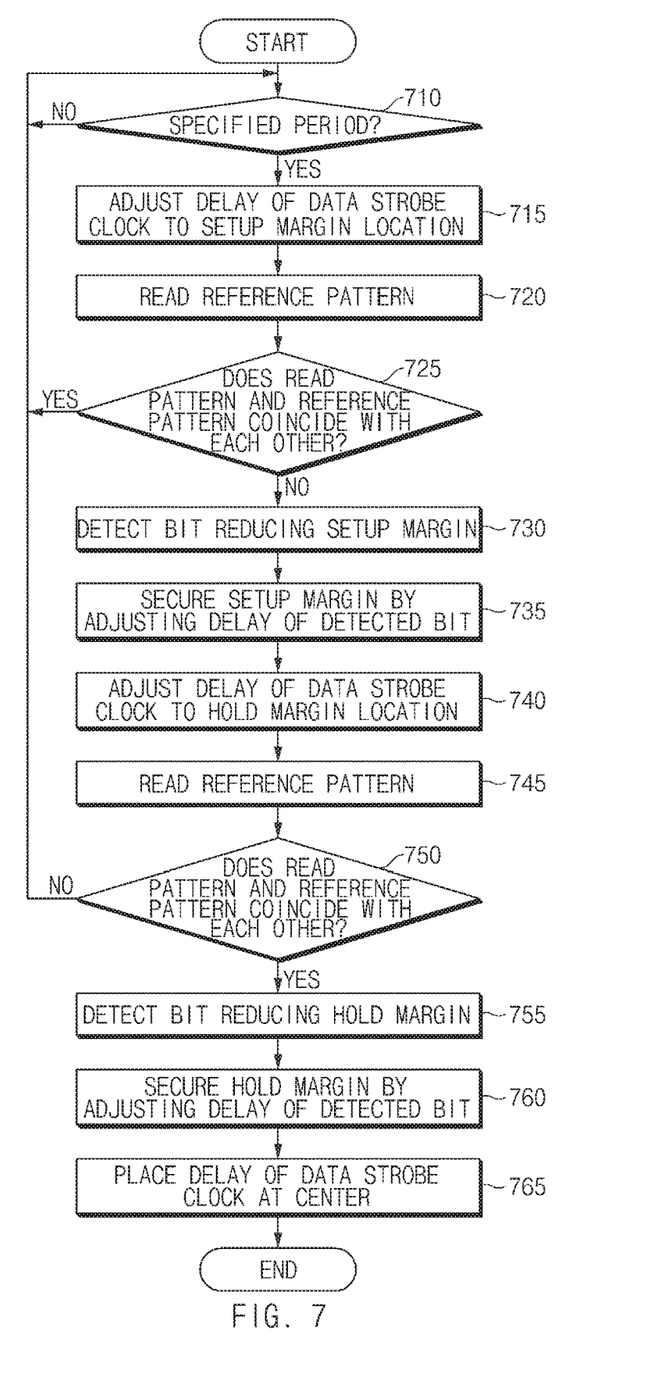
FIG. 7 is a flowchart illustrating a method for securing a timing margin of a read operation, according to an example embodiment.

FIG. 7 is a flowchart illustrating a method for securing a timing margin of a read operation, according to an example embodiment.

Referring to FIG. 7, in operation 710, the memory controller 40 may verify whether a specified period arrives. If the specified period arrives, the memory controller 40 may perform the read test. In an example embodiment, after an initialization operation is performed and a threshold time elapses or after a read operation is performed by a threshold count, the memory controller 40 may verify whether the specified period arrives. In the case where an operation (e.g., a read operation or a write operation) requested by the processor is present, the memory controller 40 may perform the read test after performing the requested operation. The memory controller 40 may make the requested operation wait until the read operation is completed.

If the specified period arrives, in operation 715, the memory controller 40 may adjust a delay of the data strobe clock such that a specified edge of the data strobe clock corresponds to a setup margin location.

In operation 720, the memory controller 40 may read a reference pattern, which is stored at a first address of the memory device 20, from the memory device 20. In an example embodiment, the reference pattern may be stored in the process of initializing the memory device 20. In another example embodiment, the reference pattern may be stored immediately before a delay of the data strobe clock is adjusted.

In operation 725, the memory controller 40 may verify whether the read pattern and the specified reference pattern coincide with each other. The specified reference pattern may be stored in an internal memory of the memory controller 40.

If the read pattern and the specified reference pattern do not coincide with each other, in operation 730, the memory controller 40 may detect an unconformable bit as a bit that reduces the setup margin.

In operation 735, the memory controller 40 may adjust a delay of the bit, which reduces the setup margin, in a direction in which the setup margin increases. For example, the memory controller 40 may secure the setup margin by advancing a delay of the detected data bit.

In operation 740, the memory controller 40 may adjust a delay of the data strobe clock such that the specified edge of the data strobe clock corresponds to a hold margin location.

In operation 745, the memory controller 40 may read the reference pattern from the first address of the memory device 20.

In operation 750, the memory controller 40 may verify whether the read pattern and a reference pattern stored therein coincide with each other.

If the read pattern and the reference pattern do not coincide with each other, in operation 755, the memory controller 40 may detect all bits, which does not coincide with the corresponding bit of the reference pattern, from among the bits constituting the read pattern as at least one bit that reduces the hold margin.

In operation 760, the memory controller 40 may adjust a delay of the detected data bit, which reduces the hold margin, in a direction in which the hold margin increases. For example, the memory controller 40 may secure the hold margin by delaying a delay of the detected data bit.

In operation 765, the memory controller 40 may place a delay of the data strobe clock at the center of the timing margin after the read test is completed.

The case where the memory controller 40 tests the hold margin of the read operation after testing the setup margin of the read operation is described with reference to FIG. 7 as an example. According to another example embodiment, the setup margin of the read operation may be tested after the hold margin of the read operation is tested.

The case where the setup margin and the hold margin are tested in one read test process is described with reference to FIG. 7 as an example. However, according to another example embodiment, the memory controller 40 may alternately test the setup margin and the hold margin. For example, the memory controller 40 may test the setup margin of the read operation in an odd-numbered read test process and may test the hold margin of the read operation in an even-numbered read test process.

Figure 8:
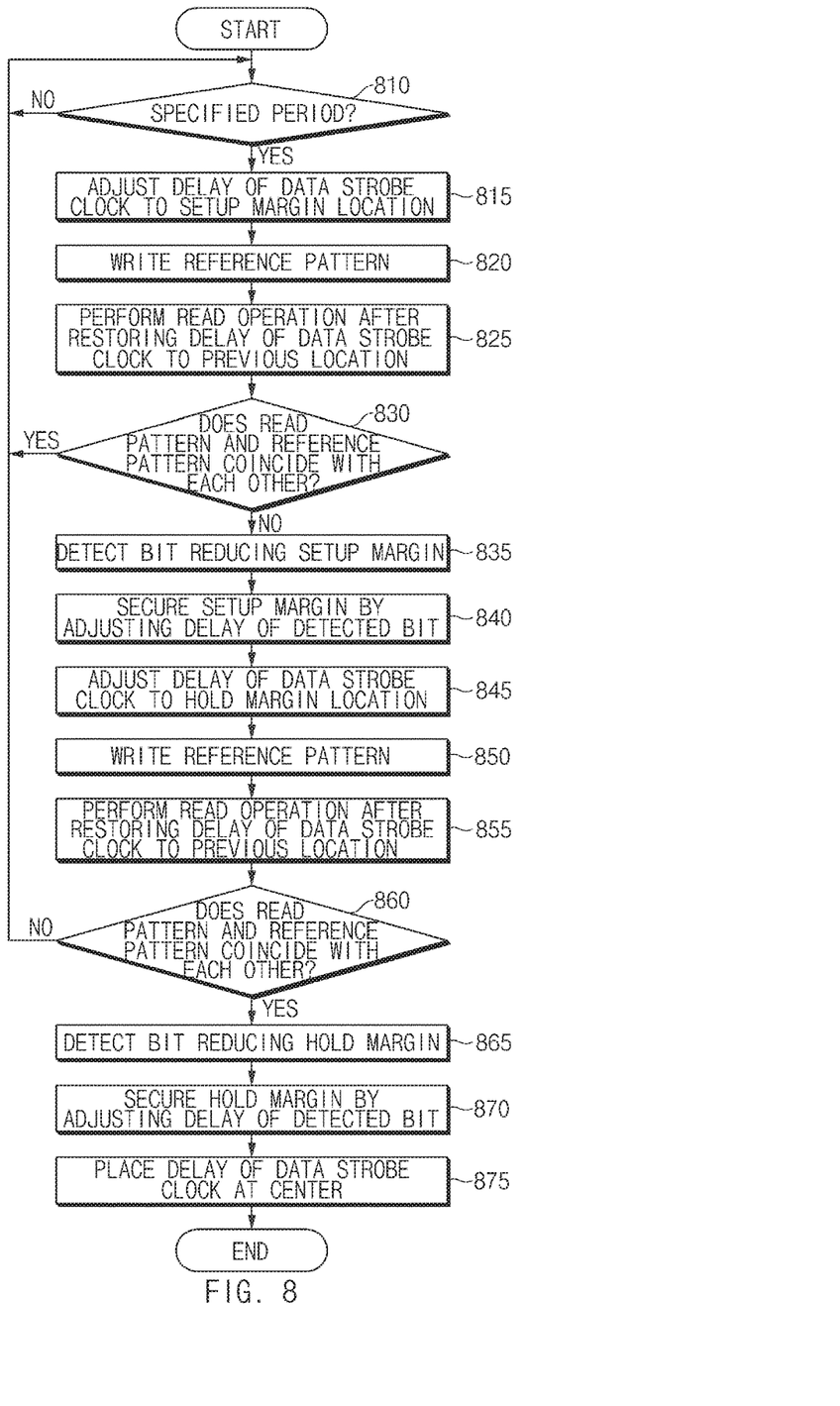
FIG. 8 is a flowchart illustrating a method for securing a timing margin of a write operation, according to an example embodiment.

FIG. 8 is a flowchart illustrating a method for securing a timing margin of a write operation, according to an example embodiment.

Referring to FIG. 8, in operation 810, the memory controller 40 may verify whether a specified period arrives. If the specified period arrives, in operation 810, the memory controller 40 may verify whether an operation (e.g., a read operation or a write operation) requested by the processor is present. In the case where the requested read or write operation is present, the memory controller 40 may perform the write test after performing the requested operation. In the case where the read or write operation is requested, the memory controller 40 may make the requested operation wait until the write test is completely performed.

In operation 815, to test the write setup margin, the memory controller 40 may adjust a delay of the data strobe clock such that the specified edge of the data strobe clock corresponds to a setup margin location.

In operation 820, the memory controller 40 may write a reference pattern at a first address of the memory device 20. In an example embodiment, the first address may be a fixed address or a variable address. For example, the first address may be the first address of an area in which data of the memory device 20 are not stored.

In operation 825, the memory controller 40 may restore the data strobe clock to a previous location and may perform the read operation to read the reference pattern from the first address of the memory device 20. For example, the memory controller 40 may adjust a delay of the data strobe clock to be opposite to the delay adjusted in operation 815.

In operation 830, the memory controller 40 may verify whether each bit of the read pattern and each bit of an internally stored reference pattern coincides with each other.

If the read pattern and the specified reference pattern do not coincide with each other, in operation 835, the memory controller 40 may detect all bits, which does not coincide with the corresponding bit of the reference pattern, from among the bits constituting the read pattern as at least one bit that reduces the setup margin.

In operation 840, the memory controller 40 may adjust a delay of the detected data bit in a direction in which the setup margin increases. For example, the memory controller 40 may secure the setup margin by advancing a delay of the detected data bit.

In operation 845, to test the write hold margin, the memory controller 40 may adjust a delay of the data strobe clock such that the specified edge of the data strobe clock corresponds to a hold margin location.

In operation 850, the memory controller 40 may write a specified reference pattern at a second address of the memory device 20. In an example embodiment, the second address may be a fixed address or a variable address. For example, the second address may be the first address of an area of the memory device 20, in which data are not stored.

In operation 855, the memory controller 40 may restore the data strobe clock to a previous location and may read the reference pattern from the second address of the memory device 20. In an example embodiment, the memory controller 40 may adjust a delay of the data strobe clock to be opposite to the delay adjusted in operation 845.

In operation 860, the memory controller 40 may verify whether the read pattern and a reference pattern stored therein coincide with each other.

If the read pattern and the reference pattern do not coincide with each other, in operation 865, the memory controller 40 may detect an unconformable bit.

In operation 870, the memory controller 40 may adjust a delay of the detected data bit in a direction in which the hold margin increases. For example, the memory controller 40 may secure the hold margin by delaying a delay of the detected data bit.

In operation 875, the memory controller 40 may center the data strobe clock adjusted through at least one of operation 840 and operation 870.

The case where the memory controller 40 tests the hold margin of the write operation after testing the setup margin of the write operation is described with reference to FIG. 8 as an example. According to another example embodiment, the setup margin of the write operation may be tested after the hold margin of the write operation is tested.

The case where the setup margin and the hold margin are tested at the same time in one write test is described with reference to FIG. 8 as an example. However, according to another example embodiment, the memory controller 40 may alternately test the setup margin and the hold margin in one write test. For example, the memory controller 40 may test the setup margin of the write operation in an odd-numbered period and may test the hold margin of the write operation in an even-numbered period.

In an example embodiment, addresses at which reference patterns are written to verify the setup margin and the hold margin during one write test may be different from each other. In an example embodiment, it may be possible to prevent the write test from being abnormally performed by abnormally verifying a reference pattern written in a previous test process upon verifying the setup margin and the hold margin. In another example embodiment, the reference pattern may be erased after one write test.

In an example embodiment, the memory controller 40 may use different reference patterns in the read test and the write test. In an example embodiment, the memory controller 40 may use different addresses in the read test and the write test.

Figure 9:
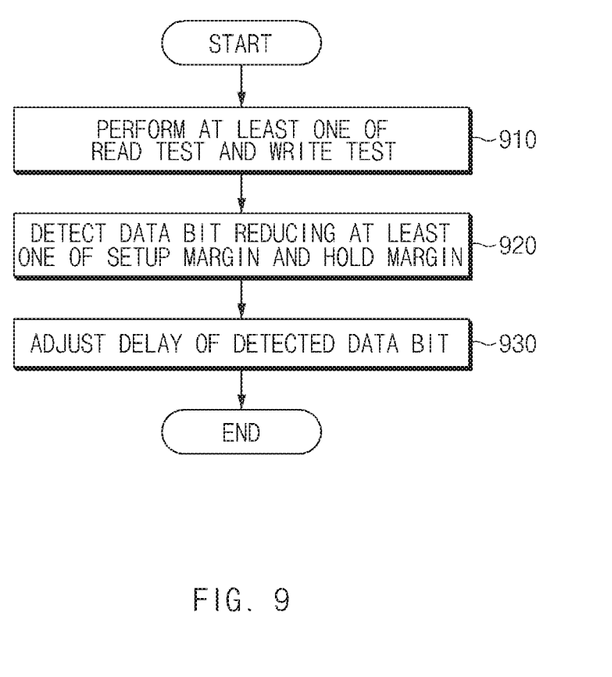
FIG. 9 is a flowchart illustrating a memory control method according to an example embodiment.

FIG. 9 is a flowchart illustrating a memory control method according to an example embodiment.

Referring to FIG. 9, in operation 910, the memory controller 40 may perform at least one of the read test and the write test on a memory device while adjusting a delay of the data strobe clock.

In operation 920, the memory controller 40 may detect at least one data bit, which reduces at least one of the setup margin and the hold margin, from among a plurality of data bits.

In operation 930, the memory controller 40 may adjust a delay of the detected data bit such that the at least one margin increases.

The term "module" used in this specification may include a unit implemented with hardware, software, or firmware. For example, the term "module" may be interchangeably used with the term "logic", "logic block", "component", "circuit", and the like. The "module" may be an integrated component, a minimum unit for performing one or more functions, or a part thereof. The "module" may be implemented mechanically or electronically. For example, the module may include a well-known or to-be-developed application-specific integrated circuit (ASIC) chip, field-programmable gate arrays (FPGAs), or programmable logic device that perform any operations.

At least part of a device (e.g., modules or functions thereof) or a method (e.g., operations) according to various example embodiments may be implemented by instructions stored in a computer-readable storage medium in the form of a program module. The instruction, when executed by a processor, may cause the processor to perform a function corresponding to the instruction. A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The instruction may include a code created by a complier or a code executable by an interpreter. A module or a program module according to various example embodiments may include at least one or more of the above-mentioned elements, some of the above-mentioned elements may be omitted, or other additional elements may be further included therein.

Operations executed by modules, program modules, or other elements may be executed by a successive method, a parallel method, a repeated method, or a heuristic method. Alternatively, at least some of the operations may be executed in another order or may be omitted, or any other operation may be added. While the present disclosure has been shown and described with reference to various example embodiments thereof, it will be understood by those skilled in the art that various changes in form and details may be made therein without departing from the spirit and scope of the present disclosure as defined by the appended claims and their equivalents.

According to an example embodiment, it may be possible to improve deterioration of the timing margin of a memory interface due to power integration (PI) and signal integrity (SI) influences.

While the present disclosure has been shown and described with reference to various example embodiments thereof, it will be understood by those skilled in the art that various changes in form and details may be made therein without departing from the spirit and scope of the present disclosure as defined by the appended claims and their equivalents.

What is claimed is:

1. A memory system comprising:
   a memory device; and
   a memory controller electrically connected with the memory device and having a specified reference pattern stored therein,
   wherein the memory controller is configured to:
   adjust a delay of a data strobe clock;
   perform a test on the memory device while adjusting the delay of the data strobe clock;
   read a reference pattern from the memory device;
   detect a first data bit of a plurality of data bits which reduces a margin by comparing bits constituting the read reference pattern and bits constituting the specified reference pattern, the margin corresponding to one among a setup margin and a hold margin; and
   adjust a delay of the first data bit to allow the margin to increase.

2. The memory system of claim 1, wherein the memory controller is further configured to adjust the data strobe clock to a specified setup margin location before performing the test.

3. The memory system of claim 1, wherein the memory controller is further configured to adjust the data strobe clock to a specified hold margin location before performing the test.

4. The memory system of claim 1, wherein the test is a read test, and
   the first data bit is a bit which does not coincide with the bits constituting the specified reference pattern among the bits constituting the reference pattern read from the memory device.

5. The memory system of claim 4, wherein the memory controller is further configured to store the specified reference pattern in the memory device before adjusting the delay of the data strobe clock; and
   read the reference pattern from the memory device after adjusting the data strobe clock to one among a specified setup margin location and a specified hold margin location.

6. The memory system of claim 1, wherein the test is a write test, and
   wherein the first data bit is a bit which does not coincide with the bits constituting the specified reference pattern among the bits constituting the reference pattern read from the memory device.

7. The memory system of claim 6, wherein the memory controller is further configured to:
   write the specified reference pattern in the memory device after adjusting the data strobe clock to one among a specified setup margin location and a specified hold margin location; and
   read the reference pattern stored in the memory device after restoring the data strobe clock to a previous location.

8. The memory system of claim 1, wherein the memory controller is further configured to perform the test when a read operation and a write operation are not performed on the memory device after initialization of the memory device.

9. The memory system of claim 8, wherein the memory controller is further configured to:
   perform the test after the read operation is performed by at least a first threshold count; and
   perform the test after the write operation is performed by at least a second threshold count.

10. The memory system of claim 1, wherein the memory controller is further configured to adjust the delay of the data strobe clock such that the data strobe clock is placed at a center of a timing margin which is a sum of the setup margin and the hold margin.

11. A method of controlling a memory system, the method comprising:
    adjusting a delay of a data strobe clock;
    performing a test on a memory device;
    reading a reference pattern from the memory device;
    detecting a first data bit of a plurality of data bits which reduces a margin by comparing bits constituting the read reference pattern and bits constituting a specified reference pattern stored in a memory controller, the margin corresponding to one among a setup margin and a hold margin; and
    adjusting a delay of the first data bit to allow the margin to increase.

12. The method of claim 11, wherein the performing includes adjusting the data strobe clock to a specified setup margin location before performing the test.

13. The method of claim 11, wherein the test is a read test, and
wherein the performing of the test includes adjusting the data strobe clock to one among a specified setup margin location and a specified hold margin location before performing the test.

14. The method of claim 13, wherein the performing of the test includes storing the specified reference pattern stored in an internal memory of the memory device before adjusting the delay of the data strobe clock.

15. The method of claim 11, wherein the test is a write test, and
wherein the performing of the test includes:
writing the specified reference pattern in the memory device; and
reading the reference pattern from the memory device.

16. The method of claim 15, wherein the writing includes writing the specified reference pattern in the memory device after adjusting the data strobe clock to one among a specified setup margin location and a specified hold margin location.

17. The method of claim 16, wherein the reading includes:
restoring the data strobe clock to a previous location before adjusting the one among the specified setup margin location and the specified hold margin location; and
reading the reference pattern from the memory device.

18. The method of claim 11, wherein the first data bit is a bit which does not coincide with the bits constituting the specified reference pattern among the bits constituting the reference pattern read from the memory device.

19. The method of claim 11, wherein the performing is performed in at least one case among a first case where a read operation is performed by at least a first threshold count after initialization of the memory device and a second case where a write operation is performed by at least a second threshold count after initialization of the memory device.

20. A memory controller comprising:
a storage unit configured to store a setup margin, a hold margin, and a specified reference pattern; and
a processor configured to adjust a delay of a data strobe clock, perform a test on a memory device while adjusting the delay of the data strobe clock, read a reference pattern from a memory device, detect a first data bit of a plurality of data bits which reduces a margin corresponding to one among the setup margin and the hold margin by comparing bits constituting the read reference pattern and bits constituting the specified reference pattern, and adjust a delay of the first data bit to allow the margin to increase.

* * * * *